(12) United States Patent
Park

(10) Patent No.: US 7,732,813 B2
(45) Date of Patent: Jun. 8, 2010

(54) IMAGE SENSOR AND METHOD FOR MANUFACTURING THE SAME

(75) Inventor: Jin Ha Park, Echeon-si (KR)

(73) Assignee: Dongbu Hitek Co., Ltd., Seoul (KR)

( * ) Notice: Subject to any disclaimer, the term of this patent is extended or adjusted under 35 U.S.C. 154(b) by 137 days.

(21) Appl. No.: 11/842,608

(22) Filed: Aug. 21, 2007

(65) Prior Publication Data
US 2008/0224137 A1 Sep. 18, 2008

(30) Foreign Application Priority Data
Mar. 14, 2007 (KR) .................... 10-2007-0024915

(51) Int. Cl.
*H01L 31/0376* (2006.01)
(52) U.S. Cl. .................. 257/53; 438/400; 438/510; 438/514
(58) Field of Classification Search ..................
257/E21.575–21.597, E21.627, E21.641,
257/53, 59, 72, 334, 434, 443, 444, 446,
257/457–459, 448, 449; 438/45, 400, 418,
438/434, 510, 514
See application file for complete search history.

(56) References Cited

U.S. PATENT DOCUMENTS 5,744,822 A * 4/1998 Takayama et al. ............. 257/66

| | | | |
|---|---|---|---|
| 6,051,867 A * | 4/2000 | Theil et al. .................. | 257/444 |
| 6,720,594 B2 | 4/2004 | Rahn et al. | |
| 6,759,724 B2 * | 7/2004 | Cao et al. .................... | 257/443 |
| 6,809,358 B2 * | 10/2004 | Hsieh et al. ................. | 257/291 |
| 6,852,566 B2 * | 2/2005 | Yaung ......................... | 438/74 |
| 7,141,826 B2 * | 11/2006 | Ko et al. ...................... | 257/82 |
| 7,419,892 B2 * | 9/2008 | Sheppard et al. ............ | 438/522 |
| 2003/0107100 A1 | 6/2003 | Cao et al. | |
| 2006/0091407 A1 * | 5/2006 | Ko et al. ...................... | 257/82 |

FOREIGN PATENT DOCUMENTS

KR    10-2005-0117674    12/2005

OTHER PUBLICATIONS

U.S. Appl. No. 11/842,580, filed Aug. 21, 2007 (Publication No. US-2008-0258189-A1; published Oct. 23, 2008); Inventor: Seong Gyun Kim (currently pending claims provided).

* cited by examiner

*Primary Examiner*—Wai-Sing Louie
*Assistant Examiner*—Sue Tang
(74) *Attorney, Agent, or Firm*—Saliwanchik Lloyd & Saliwanchik

(57) ABSTRACT

An image sensor and a method of manufacturing the same are provided. A metal wiring layer is formed on a semiconductor substrate including a circuit region, and first conductive layers are formed on the metal layer separated by a pixel isolation layer. An intrinsic layer is formed on the first conductive layers, and a second conductive layer is formed on the intrinsic layer.

14 Claims, 4 Drawing Sheets

IMAGE SENSOR AND METHOD FOR MANUFACTURING THE SAME

CROSS-REFERENCE TO RELATED APPLICATION

The present application claims the benefit under 35 U.S.C. §119 of Korean Patent Application No. 10-2007-0024915, filed Mar. 14, 2007, which is hereby incorporated by reference in its entirety.

BACKGROUND

In general, an image sensor is a semiconductor device for converting optical images into electrical signals, and is mainly classified as a charge coupled device (CCD) or a Complementary Metal Oxide Semiconductor (CMOS) image sensor.

CCD image sensors utilize a complicated driving scheme, consume large amounts of power, and require a multi-step photo process. This leads to the disadvantage of a complicated manufacturing process. CMOS image sensors have been looked to recently for overcoming the disadvantages of a CCD.

A CMOS image sensor sequentially detects electrical signals of pixels in a switching scheme by forming photodiodes and MOS transistors in unit pixels.

A CMOS image sensor utilizes a simpler driving scheme than the CCD image sensor. It is also capable of implementing a variety of scanning schemes and integrates signal processing in a single chip so that miniaturizing a product is possible. A CMOS image sensor uses CMOS technology so that manufacturing cost and power consumption are low.

A CMOS image sensor according to the related art has a substrate divided into a photodiode region for receiving a light signal and converting the light signal into an electrical signal, and a transistor region for processing the electrical signal.

A typical CMOS image sensor has a structure such that the photodiode and the transistor are horizontally arranged on the semiconductor substrate.

While the horizontal-type CMOS image sensor improves upon some of the disadvantages of the CCD image sensor, problems still exist in the horizontal-type image sensor.

According to the horizontal-type image sensor, the photodiode and the transistor are formed to be horizontally adjacent to each other on a substrate. Thus, the photodiode cannot encompass the entire area of a pixel region of the image sensor, leading to a reduced fill factor or limited resolution.

In addition, with a horizontal-type image sensor of the related art, it is very difficult to achieve optimization for a process simultaneously manufacturing the photodiode and the transistor. In particular, a shallow junction is required for a low sheet resistance in a rapid transistor process, but the shallow junction may not be appropriate for the photodiode.

Furthermore, according to the horizontal-type CMOS image sensor of the related art, additional on-chip functions are added to the image sensor so that the sizes of unit pixels are increased or reduced in order to maintain the sensitivity of the image sensor. When the size of the unit pixel is increased, the resolution of the horizontal-type CMOS image sensor decreases. In addition, when the area of the photodiode is decreased, the sensitivity of the horizontal-type CMOS image sensor decreases. Thus, there exists a need in the art for a CMOS image sensor and fabricating method with an improved fill factor.

BRIEF SUMMARY

Embodiments of the present invention provide an image sensor and a method for manufacturing the same capable of vertically integrating a transistor circuit and a photodiode.

An image sensor according to an embodiment of the present invention includes: a metal wiring layer formed on a semiconductor substrate including a circuit region; first conductive layers separated from each other by pixel isolation layers on the metal wiring layer; an intrinsic layer formed on the first conductive layers; and second conductive layers formed on the intrinsic layer.

Also, a method for manufacturing an image sensor according to an embodiment of the present invention includes the steps of: forming a metal wiring layer on a semiconductor substrate including a circuit region; forming a first semiconductor layer on the metal wiring layer; forming first conductive layers by implanting a first impurity in the first semiconductor layer; forming an intrinsic layer formed on the first conductive layers; forming a second conductive layer on the intrinsic layer; and optionally forming an upper electrode on the second conductive layer.

DETAILED DESCRIPTION

When the terms "on" or "over" are used herein, when referring to layers, regions, patterns, or structures, it is understood that the layer, region, pattern or structure can be directly on another layer or structure, or intervening layers, regions, patterns, or structures may also be present. When the terms "under" or "below" are used herein, when referring to layers, regions, patterns, or structures, it is understood that the layer, region, pattern or structure can be directly under the other layer or structure, or intervening layers, regions, patterns, or structures may also be present.

Figure 6:
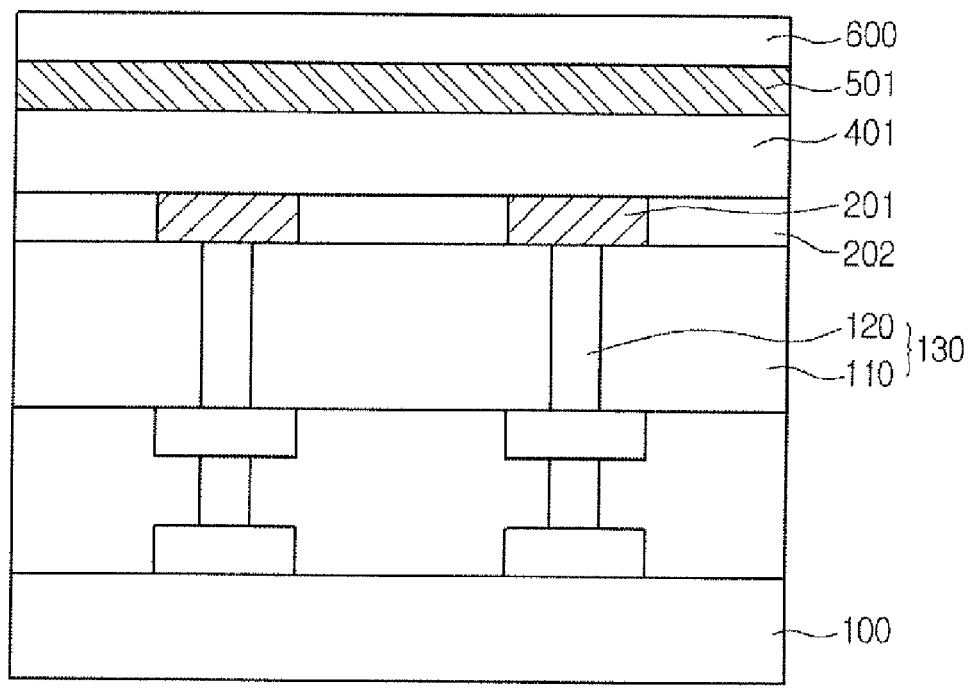

Referring to FIG. 6, an image sensor according to an embodiment of the present invention includes: a metal wiring layer 130 formed on a semiconductor substrate 100 including a circuit region; first conductive layers 201 formed on the metal wiring layer 130; an intrinsic layer 401 formed on the first conductive layers 201; and a second conductive layer 501 formed on the intrinsic layer 401.

A pixel isolation layer 202 is formed between the first conductive layers 201 to separate the first conductive layers 201 into unit pixels. The pixel isolation layer 202 helps inhibit crosstalk.

In an embodiment, an upper electrode 600 can be formed on the second conductive layer 501.

Figure 8:
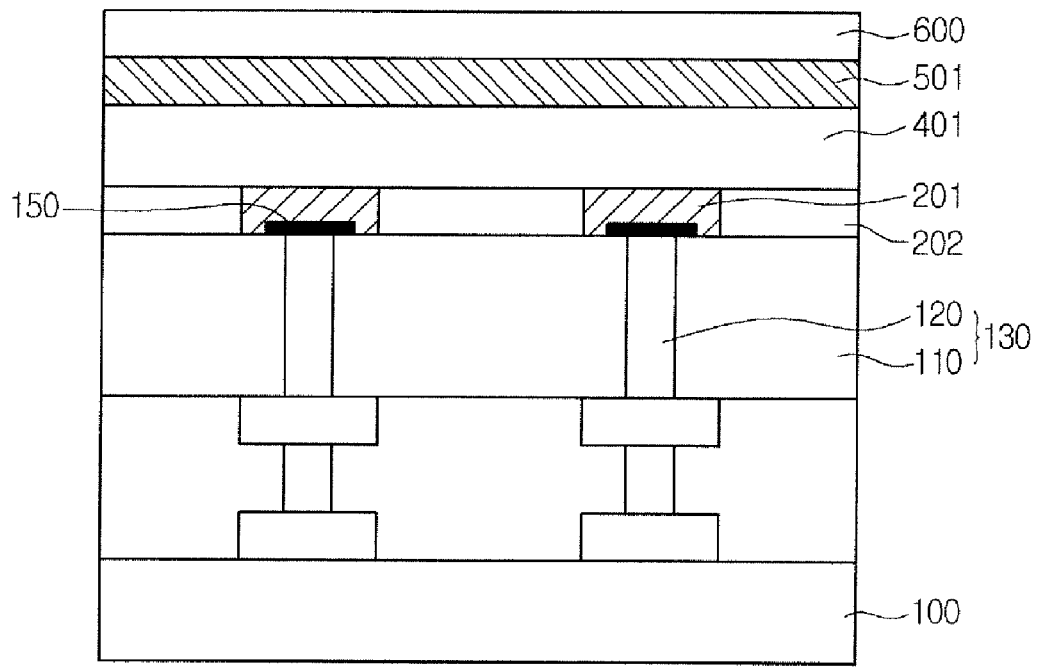
FIG. 8 is a cross-sectional view of an image sensor according to an embodiment of the present invention.

In a further embodiment as illustrated in FIG. 8, a lower electrode 150 can be formed between the first conductive layer 201 and each metal wiring 120.

The image sensor of the present invention can provide a vertical-type integration of a transistor circuit and a photodiode.

The vertical-type integration of the transistor and the photodiode allows the fill factor to approach 100%.

Also, the vertical-type integration makes it possible to achieve higher sensitivity than the related art for the same pixel size.

In addition, the vertical-type integration reduces the process cost to achieve the same resolution, as compared to the related art.

Furthermore, the unit pixels of an image sensor of the present invention can implement a complex circuit without reducing sensitivity.

Hereinafter, a method for manufacturing an image sensor according to an embodiment of the present invention will be described with reference to FIGS. 1 to 6.

Figure 1:
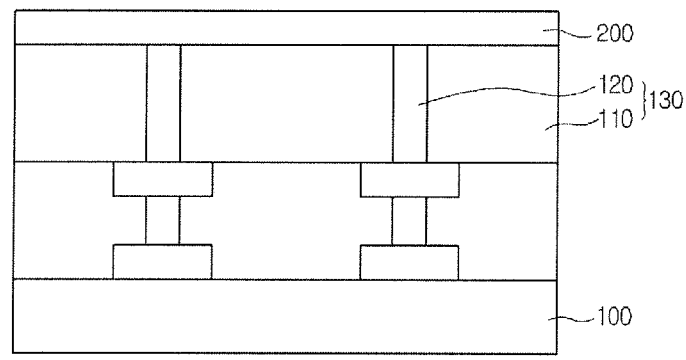
FIGS. 1 to 6 are cross-sectional views showing a method for manufacturing an image sensor according to an embodiment of the present invention.

Referring to FIG. 1, a metal wiring layer 130, which includes a plurality of metal wirings 120 and an interlayer dielectric layer 110, can be formed a semiconductor substrate 100 on which a circuit region (not shown) is formed.

In an embodiment, a device isolation film (not shown) defining an active region and a field region can be formed on the semiconductor substrate 100. A circuit region on the semiconductor substrate 100 can include, for example, a transfer transistor, a reset transistor, a drive transistor, and a select transistor.

The plurality of metal wirings 120 can be formed of any appropriate conductive material, such as metal, alloy, or silicide. For example, the plurality of metal wirings 120 can be formed of aluminum, copper, cobalt, or tungsten, among other materials.

When forming the plurality of metal wirings 120 in the interlayer dielectric layer 110, one metal wiring 120 can be formed in each unit pixel for connecting the photodiode to the circuit region. Other metal wirings (not shown) can be included for power and signal lines.

A photodiode can be formed on the metal wiring layer 130 electrically connected to the metal wiring 120.

In an embodiment as illustrated in FIG. 8, prior to forming the photodiode, a lower electrode 150 for the photodiode can be formed on each metal wiring 120. The size of the lower electrode 150 can be selected as desired. For example, the lower electrode 150 can be formed smaller, larger, or the same size as the first conductive layer 201 for a pixel. FIG. 8 shows a lower electrode 150 that has a smaller size than the first conductive layer 201. According to embodiments, the lower electrode can be formed of a metal, such as Cr, Ti, TiW or Ta. Alternatively, as shown in FIGS. 1-6, no lower electrode is formed.

The photodiode can be formed on the metal wiring layer 130 and receives light incident from the outside to convert into and store in an electrical form. The photodiode can involve a P-I-N structure.

In many embodiments, The P-I-N diode is formed such that an n-type amorphous silicon, an intrinsic amorphous silicon, and a p-type amorphous silicon are bonded. The performance of the photodiode is decided depending on its efficiency in receiving light from the outside and converting it into an electrical form, and total charge capacitance. Typical photodiodes formed in a substrate generate and store charge at a depletion region generated in a hetero-junction such as P-N, N-P, N-P-N, or P-N-P. However, the P-I-N diode of embodiments of the present invention is a diode that has an intrinsic amorphous silicon layer that is a pure semiconductor between a p-type silicon layer and an n-type silicon layer. The PIN diode is advantageous in generating and storing charge, since the entire intrinsic amorphous silicon layer formed between the p-type silicon layer and the n-type silicon layer becomes the depletion region.

In embodiments, the P-I-N diode can be used as the photodiode, and the structure of the P-I-N diode can be formed as P-I-N or N-I-P. For example, in an embodiment in which the P-I-N diode has the P-I-N structure, the n-type amorphous silicon is referred to as the first conductive layer 201, the intrinsic amorphous silicon is referred to as the intrinsic layer 401, and the p-type amorphous silicon is referred to as the second conductive layer 501.

Referring to FIG. 1, in order to form the first conductive layer 201, which, in many embodiments, is an "N" layer of a P-I-N diode, a first semiconductor layer 200 is formed on the metal wiring layer 130. The first semiconductor layer 200 can be formed using amorphous silicon. The first semiconductor layer 200 can be formed by chemical vapor deposition (CVD), such as plasma enhanced chemical vapor deposition (PECVD) For example, the first semiconductor layer 200 can be formed of amorphous silicon by PECVD using silane gas $SiH_4$.

Figure 2:
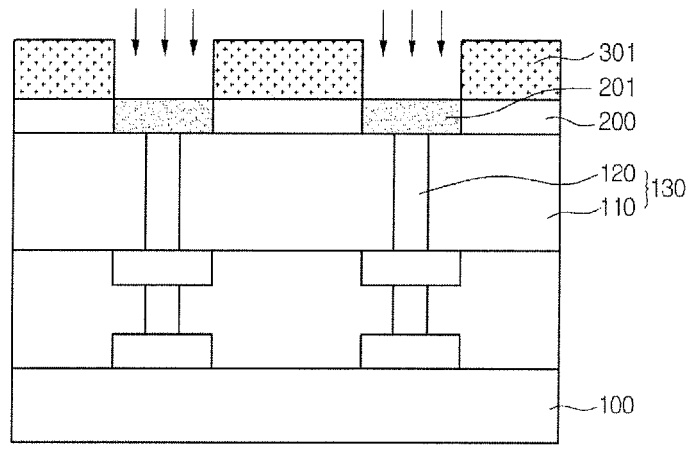

Referring to FIG. 2, a photoresist film can be applied on the first semiconductor layer 200 to form a mask pattern 301. The mask pattern 301 can be formed such that at least the portion of the first semiconductor layer 200 that covers (i.e. is directly over) each metal wiring 120 is exposed.

Next, the first conductive layer 201 can be formed by implanting an n-type impurity in the first semiconductor layer 200 using the photoresist mask pattern 301 as an implantation mask. For example, the n-type impurities can be group V elements, such as phosphorous (P) and/or arsenic (As). An ion implant method can be used to implant the n-type impurities.

Thus, the first semiconductor layer 200 can be divided into the first conductive layers 201, each connected to the metal wiring 120, and the pixel isolation layer 202, formed between the first conductive layers 201 and not connected to the metal wiring 120.

Accordingly, each metal wiring 120 and first conductive layer 201 become isolated into a pixel.

The mask pattern 301 can then be removed.

Figure 3:
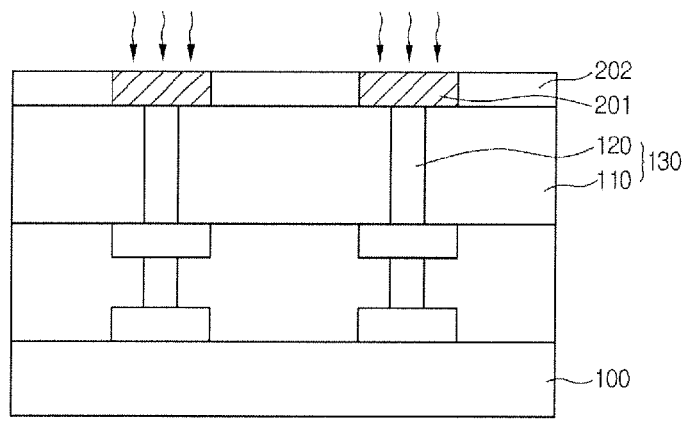

Referring to FIG. 3, an annealing process can be performed to activate the n-type impurity of the first conductive layer 201.

In many embodiments, the annealing process performed to activate the n-type impurity is a laser annealing process.

Figure 7:
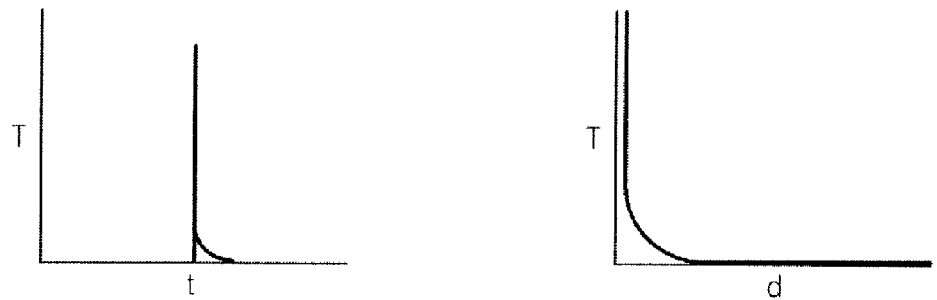
FIG. 7 is a graph showing characteristics of a laser annealing process that can be used in an embodiment of the present invention.

As shown in FIG. 7, the laser annealing process can instantly provide a high temperature (T) to the substrate on which the annealing process is performed for a very short time (t). Additionally, the smaller the region of the substrate on which the annealing is performed, the higher the temperature (T) achieved.

In embodiments of the present invention, the first conductive layers 201 are separated by the pixel isolation layer 202 into unit pixels. This isolation of the n-doped first conductive layer 201 efficiently inhibits crosstalk.

Figure 4:
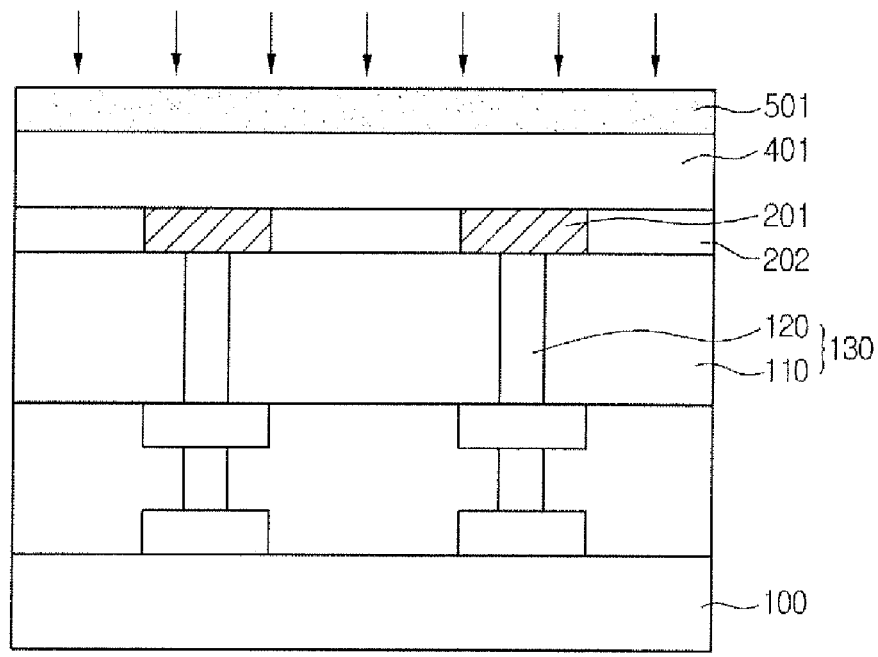

Referring to FIG. 4, a second semiconductor layer is deposited on the first conductive layer 201 and the pixel isolation layer 202 to form the intrinsic layer 401. In many embodiments, the intrinsic layer 401 functions as the "I" layer of a P-I-N diode.

The intrinsic layer 401 can be formed using amorphous silicon. The intrinsic layer 401 can be formed by CVD, such as PECVD. For example, the intrinsic layer 401 can be formed of amorphous silicon by PECVD using silane gas $SiH_4$.

In many embodiments, the intrinsic layer 401 is about 10 to about 1000 times thicker than the first conductive layer 201. This is because the depletion region of the photodiode is increased proportional to the thickness of the intrinsic layer 401, leading to storage and generation of a large amount of light charge.

Next, the second conductive layer 501 can be formed by implanting a p-type impurity onto the surface of the intrinsic layer 401 that is formed to a thick thickness. In another embodiment, an additional intrinsic layer can be formed on the intrinsic layer 401 for implanting the p-type impurity therein. In an embodiment, the p-type impurity can be a group III element, such as boron (B). An ion implant method can be used to implant the p-type impurity. The p-type impurity can be formed on the upper surface of the intrinsic layer 401 by controlling the energy upon implanting the p-type impurity ion.

Figure 5A:
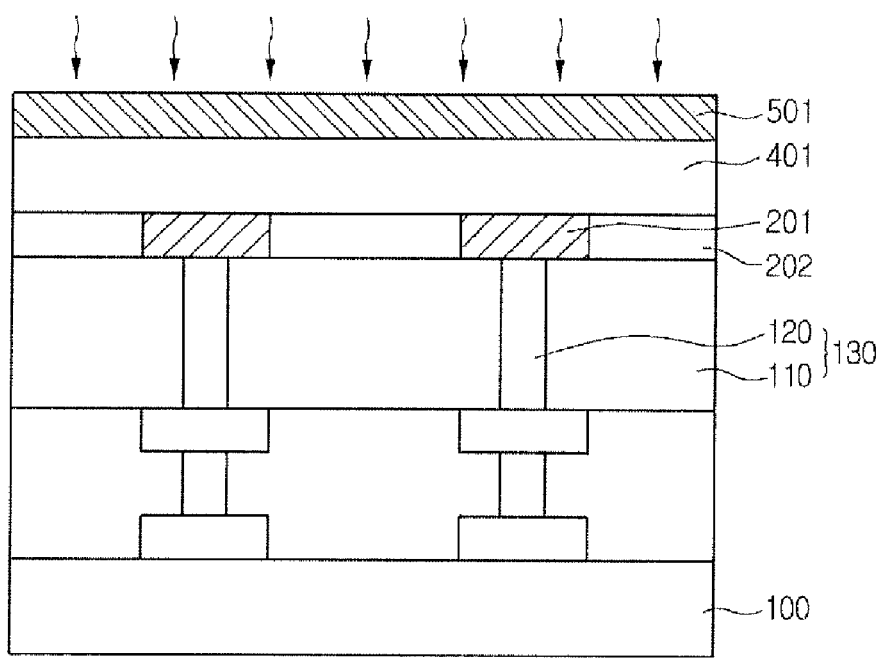

Referring to FIG. 5a, an annealing process can be performed in order to activate the p-type impurity of the second conductive layer 501. For example, the annealing process to activate the p-type impurity can be a laser annealing process.

Figure 5B:
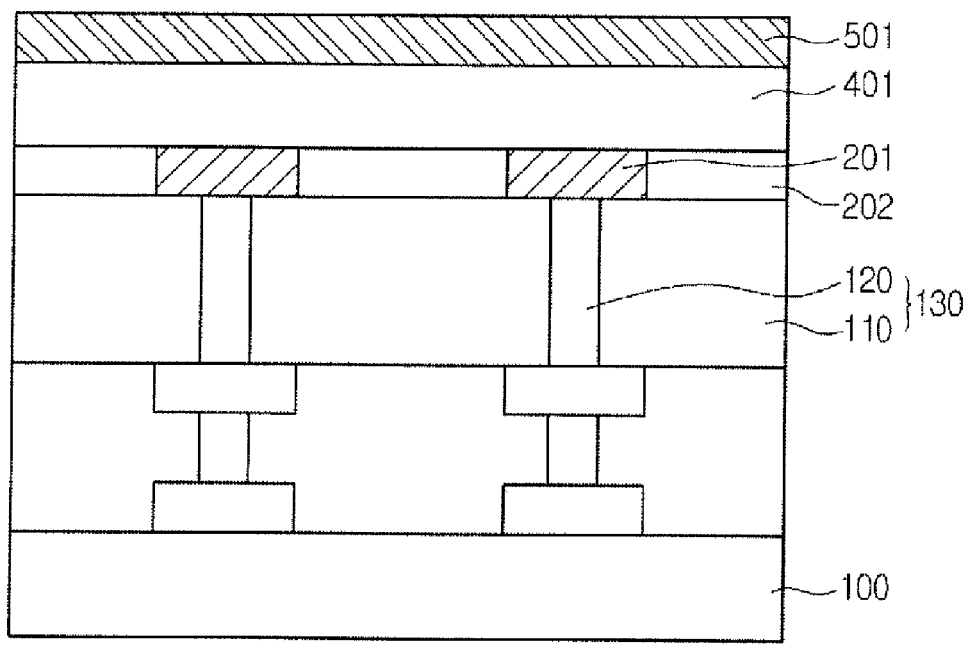

Referring to FIG. 5b, there may be other methods of forming the second conductive layer 501. In an embodiment, the second conductive layer 501 functions as a "P" layer of a P-I-N diode.

In an embodiment, the second conductive layer 501 can be formed using p-doped amorphous silicon.

The second conductive layer 501 can be formed by CVD, such as PECVD. For example, the second conductive layer 501 can be formed of the amorphous silicon by means of the PECVD using silane gas $SiH_4$.

The method of an embodiment of the present invention allows a P-I-N diode to be formed on the semiconductor substrate 100 with a vertical-type integration of the transistor circuit and the photodiode. This makes it possible to approach a fill factor of 100%.

Referring to FIG. 6, in a further embodiment, an upper electrode 600 can be formed on the second conductive layer 501.

The upper electrode 600 can be formed of a transparent material having good light-transmitting properties and high conductivity. For example, the upper electrode 600 can be formed of indium tin oxide (ITO) or cadmium thin oxide (CTO). Then, a pattern process can be performed on the upper electrode 600.

Although not shown in the drawings, In certain embodiments, a process can be performed for forming a color filter and a microlens on the upper electrode 600 or the second conductive layer 501.

The method of manufacturing an image sensor of the present invention can provide a vertical-type integration of a transistor circuit and a photodiode.

The vertical-type integration of the transistor and the photodiode allows the fill factor to approach 100%.

Also, the vertical-type integration makes it possible to achieve higher sensitivity in the same pixel size in an image sensor of the present invention than in the related art.

In addition, the vertical-type integration reduces the process cost to achieve the same resolution, as compared to the related art.

Furthermore, the unit pixels of an image sensor of the present invention can implement a complex circuit without reducing sensitivity.

Moreover, the method of the present invention gives an image sensor with insulation between unit pixels, efficiently inhibiting crosstalk and improving the reliability of the image sensor. The n-layer, i-layer, and p-layer in each unit pixel can be insulated from the corresponding layers in adjacent pixels.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method for manufacturing an image sensor, comprising:
   forming a metal wiring layer, comprising an interlayer dielectric layer and a plurality of metal wirings on a semiconductor substrate including a circuit region;
   forming a first semiconductor layer on the metal wiring layer;
   forming first conductive layers separated from each other by implanting a first impurity in the first semiconductor layer; wherein the first impurity is implanted at least in the portions of the first semiconductor layer directly over the metal wirings of the plurality of metal wirings;
   forming an intrinsic layer formed on the first conductive layers; and
   forming a second conductive layer on the intrinsic layer.

2. The method according to claim 1, further comprising forming an upper electrode on the second conductive layer.

3. The method according to claim 1, wherein forming the first conductive layers comprises:
   forming a photoresist pattern on the first semiconductor layer, exposing at least the portions of the first semiconductor layer covering the metal wirings of the plurality of metal wirings;
   implanting the first impurity using the photoresist pattern as a mask; and
   providing a pixel isolation layer between the first conductive layers by removing the photoresist pattern.

4. The method according to claim 3, further comprising performing an annealing process on the first conductive layers to activate the first impurity.

5. The method according to claim 3, wherein the intrinsic layer is from about 10 times to about 1000 times thicker than the first conductive layers.

6. The method according to claim 1, wherein the first impurity is an n-type impurity.

7. The method according to claim 1, further comprising performing an annealing process on the first conductive layers to activate the first impurity.

8. The method according to claim 7, wherein the annealing process is a laser annealing process.

9. The method according to claim 1, wherein forming the second conductive layer comprises implanting a second impurity on the intrinsic layer.

10. The method according to claim 9, further comprising performing an annealing process on the second conductive layer to activate the second impurity.

11. The method according to claim 10, wherein the annealing process is a laser annealing process.

12. The method according to claim 1, wherein forming the second conductive layer comprises:

depositing a second intrinsic layer on the intrinsic layer; and implanting a second impurity on the second intrinsic layer.

13. The method according to claim 1, wherein forming the second conductive layer comprises depositing a p doped amorphous silicon layer on the intrinsic layer.

14. The method according to claim 1, further comprising forming a lower electrode on each metal wiring of the plurality of metal wirings.

* * * * *